(12) United States Patent
Nakasuji

(10) Patent No.: US 6,614,034 B2
(45) Date of Patent: Sep. 2, 2003

(54) CHARGED-PARTICLE-BEAM MICROLITHOGRAPHY APPARATUS AND METHODS INCLUDING SHIELDING OF THE BEAM FROM EXTRANEOUS MAGNETIC FIELDS

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 132 days.

(21) Appl. No.: 09/820,257

(22) Filed: Mar. 28, 2001

(65) Prior Publication Data

US 2001/0025932 A1 Oct. 4, 2001

(30) Foreign Application Priority Data

Apr. 3, 2000 (JP) ........................ 2000-100241

(51) Int. Cl.[7] .................... H01J 37/18; H01J 37/304
(52) U.S. Cl. ..................... 250/492.22; 250/492.21; 250/492.1
(58) Field of Search ................... 250/492.22, 492.1, 250/492.21, 492.3

(56) References Cited

U.S. PATENT DOCUMENTS 4,607,167 A * 8/1986 Petric ..................... 250/492.2
4,967,088 A * 10/1990 Stengl et al. ............. 250/491.1
5,847,488 A * 12/1998 Yoshida et al. ........... 310/328

\* cited by examiner

Primary Examiner—John R. Lee
Assistant Examiner—Anthony Quash
(74) Attorney, Agent, or Firm—Klarquist Sparkman LLP

(57) ABSTRACT

Charged-particle-beam (CPB) microlithography apparatus are disclosed that do not require installation in a magnetically shielded room, and that exhibit improved attenuation of the incursion of magnetic fields, originating in linear motors used to drive motions of the reticle and substrate stages, to the charged particle beam. The illumination-optical and projection-optical systems are enclosed in respective columns made of a thick ferromagnetic material. The reticle and substrate chambers are similarly constructed. Consequently, there is very low incursion of external magnetic fields to the beam in the columns. The reticle and substrate chambers include partition shields, each having a multi-layer construction with alternating layers of ferromagnetic material sandwiched with layers of non-magnetic material, attached via non-magnetic material to the respective chambers. The partition shields prevent magnetic fields from the respective linear motors from reaching the beam inside the columns.

22 Claims, 4 Drawing Sheets

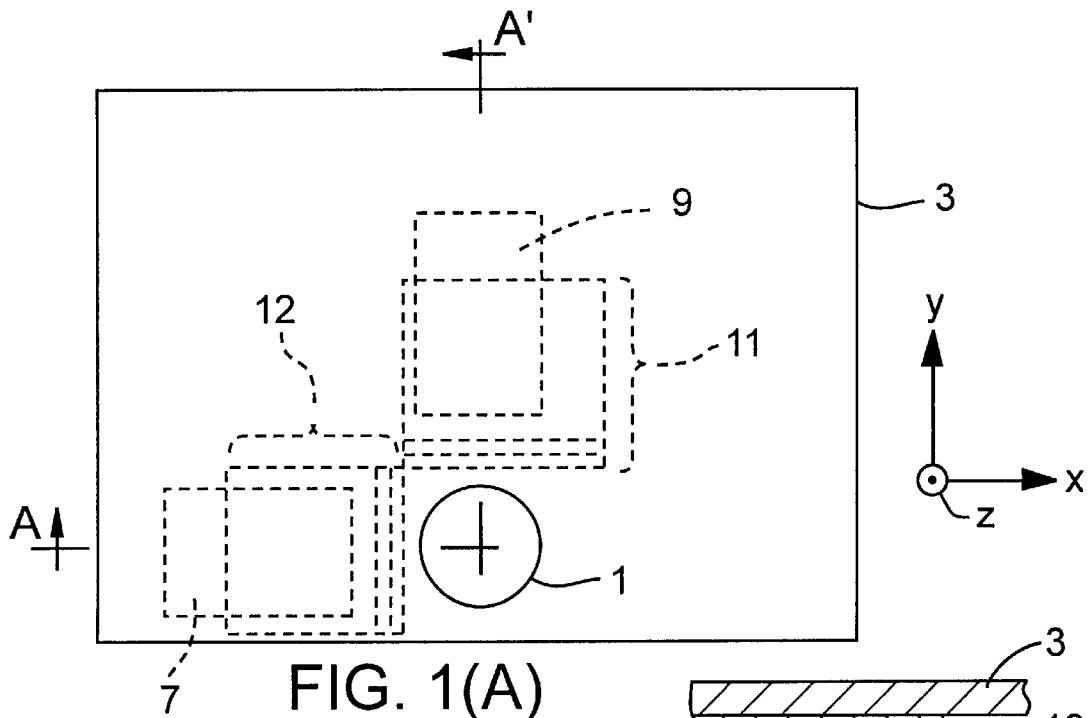
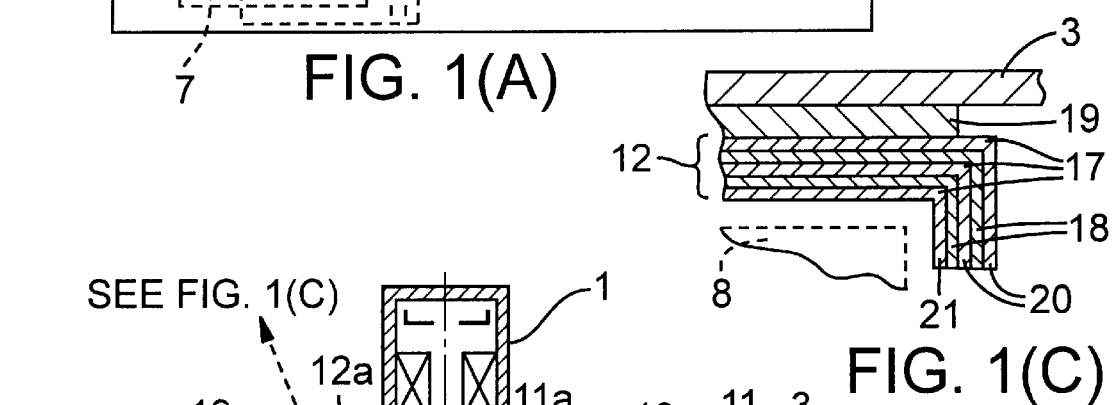
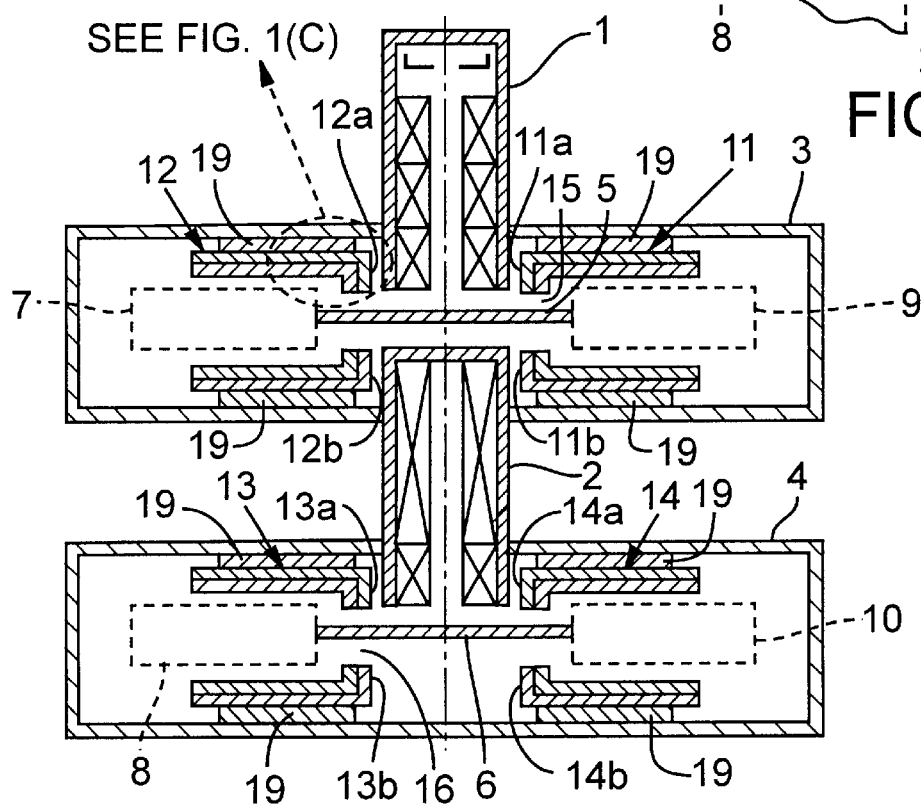
FIG. 1(A)
FIG. 1(C)
FIG. 1(B)

CHARGED-PARTICLE-BEAM MICROLITHOGRAPHY APPARATUS AND METHODS INCLUDING SHIELDING OF THE BEAM FROM EXTRANEOUS MAGNETIC FIELDS

FIELD OF THE INVENTION

The present invention pertains to microlithography (transfer of a pattern, defined on a reticle or mask, to a sensitive substrate) performed using a charged particle beam (e.g., electron beam or ion beam). Microlithography is a key technique used in the manufacture of microelectronic devices such as integrated circuits and displays. More specifically, the invention pertains to magnetically shielding the charged particle beam from adverse influences of magnetic fields generated by linear motors used to support and move a reticle stage and a substrate stage during charged-particle-beam microlithography.

BACKGROUND OF THE INVENTION

The ongoing push for increased integration in microelectronic devices has resulted in a current need for being able to transfer patterns having a minimum line width of less than 100 nm. Resolution at this level cannot be achieved using "optical" microlithography (i.e., microlithography performed using a light beam, typically a deep-ultraviolet light beam). Charged-particle-beam (CPB) microlithography is an attractive candidate technique for achieving such resolution, for essentially the same reasons that electron microscopy achieves better resolution than light microscopy.

Unfortunately, using current technology, CPB microlithography cannot be performed satisfactorily by exposing an entire reticle pattern (for an entire layer of a "die" or "chip" on the substrate) in one exposure or "shot." A promising current approach to performing exposure of entire patterns is to divide the reticle into multiple exposure units usually termed "subfields," each defining a respective portion of the overall pattern, and exposing the subfields individually according to a preset order. This approach, termed "divided-reticle" CPB microlithography, offers prospects of achieving the required resolution at a reasonable throughput.

In divided-reticle CPB microlithography, the reticle is mounted on a movable reticle stage, and the substrate (e.g., a semiconductor wafer) is mounted on a movable substrate stage. As noted above, the reticle is divided into multiple subfields that are exposed sequentially. Exposing subfields does involve a limited magnitude of lateral beam deflection. But, to expose all the subfields, coordinated movements of the reticle stage and substrate stage also are required. The coordinated movements also ensure that the respective images of the subfields are formed at respective locations on the substrate such that an image of the entire pattern is "stitched" together properly in a contiguous manner from the individual subfield images.

The reticle stage and substrate stage are driven in each of the X- and Y-directions by a respective linear-induction motor ("linear motor"). (The direction of propagation of the charged particle beam is regarded as a Z-axis direction; hence, the reticle and substrate extend in respective X–Y planes.) The reticle stage and substrate stage, as well as their accessory parts such as the respective linear motors, are housed in respective chambers termed the "reticle chamber" and "substrate chamber," respectively.

In a CPB microlithography apparatus, the charged particle beam must propagate in a "vacuum" environment (extremely low subatmospheric pressure). To such end, the various lenses, deflectors, diaphragms, and the like are contained in a "CPB-column" which is essentially a vacuum chamber. The CPB-column typically includes a first portion housing an illumination-optical system and a second portion housing a projection-optical system. In addition, the reticle chamber and substrate chamber are maintained at respective vacuum levels.

A charged particle beam, even though it is contained within a CPB-column, can be affected by external magnetic fields, which can alter or disrupt the trajectory of the beam within the column and thus degrade pattern-transfer accuracy and/or resolution. In order to obtain the desired high level of pattern-transfer accuracy and resolution, various approaches have been considered for protecting the beam from external magnetic fields. According to one approach, the entire CPB microlithography apparatus is contained in a magnetically shielded room. In this regard, see Ogasawara et al., *Teion Kogaku* 8(4):135–147, 1973. However, because a CPB microlithography apparatus is a very large machine, the room containing it also must be large, and magnetically shielding a large room is difficult and very expensive. If the shielding is performed using a ferromagnetic material having a given thickness and a given number of layers, then the shielding factor decreases in inverse proportion to the room dimensions. Hence, with increased room size, the shielding material must be made very thick and/or configured with a large number of layers to achieve the same degree of shielding in the room.

A conventional linear motor used for driving a reticle stage or a substrate stage generates a large (several hundred mGauss) DC magnetic field as well as a fluctuating magnetic field of a few dozen mGauss. These magnetic fields can have a significant effect on the charged particle beam, which presents a substantial problem in machine design. Inside the CPB-column, the effect of these magnetic fields must be reduced to about 1 mGauss or less to achieve high transfer accuracy and resolution. But, heretofore, the best approach for achieving this goal has been unclear.

SUMMARY OF THE INVENTION

In view of the shortcomings of conventional approaches as summarized above, an object of the present invention is to provide charged-particle-beam (CPB) microlithography apparatus that can achieve high pattern-transfer accuracy and resolution without having to install the apparatus in a magnetically shielded room. Another object is to reduce the effects of magnetic fields, generated by the linear motors that drive the reticle stage and substrate wafer stage, on beam trajectory in a CPB microlithography apparatus.

To such end, and according to a first aspect of the invention, CPB microlithography apparatus are provided. An embodiment of such an apparatus includes an illumination-optical system and projection-optical system contained within a CPB-column. The embodiment also includes a reticle stage configured to hold a reticle during microlithographic exposure, and a substrate stage configured to hold a substrate during microlithographic exposure. Each of these stages is actuated by a respective linear motor. The reticle stage and its respective linear motor are enclosed in a reticle chamber that is situated between the illumination-optical system and the projection-optical system and is made of a ferromagnetic material. Similarly, the substrate stage and its respective linear motor are enclosed in a substrate chamber that is situated downstream of the projection-optical system and also is made of a ferromagnetic material.

Situated in the reticle chamber is a first partition shield made of a ferromagnetic material and situated between the respective linear motor and the CPB-column. The first partition shield defines a gap allowing unobstructed movement of the reticle stage through the gap. Situated in the substrate chamber is a second partition shield made of a ferromagnetic material and situated between the respective linear motor and the CPB column. The second partition shield defines a gap allowing unobstructed movement of the substrate stage through the gap.

Desirably, each of the first and second partition shields comprises opposing lip portions having respective edges between which the respective gap is defined. Also, each partition shield desirably is attached to an inside wall of the respective chamber by a non-magnetic fastener.

Each of the reticle and substrate stages can be regarded as extending in a respective X–Y plane that is perpendicular to a Z-axis (the Z-axis normally is parallel to the optical axis of the illumination-optical and projection-optical systems). Hence, each partition shield can comprise a first portion extending in a respective X–Y plane on one side of the respective linear motor, and a second portion extending in a respective X–Y plane on an opposing side of the respective linear motor. With respect to each of the partition shields, the first and second portions desirably are attached separately to respective inside walls of the respective chamber by a non-magnetic fastener. Each of the first and second portions desirably defines a respective lip portion, wherein the lip portions are situated opposite each other in the X-direction, and the lip portions have respective edges between which the respective gap is defined.

Each of the partition shields desirably comprises multiple sheet layers of ferromagnetic material. Between each pair of sheet layers of ferromagnetic material is a respective sheet layer of non-magnetic material. This configuration is desired because it provides an enhanced magnetic-shielding effect compared to a shield consisting of a single sheet of ferromagnetic material.

With respect to each of the partition shields, the sheet layer of ferromagnetic material situated closest to the CPB-column desirably has a high relative permeability, and the sheet layer of ferromagnetic material situated closest to the respective linear motor desirably has a relatively high saturation magnetic flux density. This configuration is desirable because a linear motor produces a powerful magnetic field in the vicinity of the motor. Placing a ferromagnetic material having a high saturation magnetic flux density near the motor reduces the possibility of losing the shielding effect due to saturation of the shielding material. In contrast, the strength of the magnetic field is low nearer to the CPB-column, so the nearby shielding material need not have a high saturation magnetic flux density. Use of a high-relative permeability material instead in this location allows the material to be thinner, thereby reducing cost and bulk.

Another embodiment of a CPB microlithography apparatus comprises an illumination-optical system, projection-optical system, reticle stage, substrate stage, reticle chamber, and substrate chamber essentially as summarized above. The apparatus also includes at least one coil individually situated relative to at least one of the reticle chamber and substrate chamber. The coil is configured to circulate a magnetic flux through the ferromagnetic material of the respective chamber. Desirably, each of the reticle chamber and substrate chamber includes a respective coil, and the coils desirably are situated externally to the respective chamber. The coil desirably is configured to be energized by AC power biased by DC power, especially so as to achieve a maximal permeability of the ferromagnetic material of the respective chamber. With this embodiment, the relative permeability of the ferromagnetic material of the reticle chamber and substrate chamber can be adjusted to optimal respective values by adjusting the energization of the respective coil. Thus, a favorable magnetic shielding effect can be maintained in the chambers.

This second embodiment also can include at least one partition shield as summarized above.

According to another aspect of the invention, methods are provided (in the context of performing CPB microlithography of a pattern using a CPB microlithography apparatus) for reducing incursion of a magnetic field from the linear motor to the charged particle beam in the CPB-column. In the method, at least one partition shield, made of a ferromagnetic material, is provided. A respective partition shield is placed in each of the reticle chamber and substrate chamber that also contains a respective linear motor. The respective partition shield is situated between the respective linear motor and the CPB-column, and defines a gap allowing unobstructed movement of the respective stage through the gap. The partition shield can be provided with a first portion and a second portion. The first portion is situated so as to extend in a respective X–Y plane on one side of the respective linear motor, and the second portion is situated so as to extend in a respective X–Y plane on an opposing side of the respective linear motor. Each partition shield can be provided with multiple sheet layers of ferromagnetic material, wherein a separate sheet layer of non-magnetic material is interposed between each pair of sheet layers of ferromagnetic material.

At least one sheet layer of ferromagnetic material desirably has a high relative permeability, and at least one other sheet layer of ferromagnetic material desirably has a relatively high saturation magnetic flux density. In such an instance, the sheet layer having high relative permeability desirably is situated closest to the CPB-column, and the sheet layer having the relatively high saturation magnetic flux density desirably is situated closest to the respective linear motor.

This method can include the step of situating a coil relative to the respective chamber containing the linear motor, and configuring the coil to circulate, whenever the coil is electrically energized, a magnetic flux through the ferromagnetic material of the respective chamber. To such end, the coil desirably is energized by AC power biased by DC power.

The foregoing and additional features and advantages of the invention will be more readily apparent from the following detailed description, which proceeds with reference to the accompanying drawings.

BRIEF DESCRIPTION OF THE DRAWINGS

FIGS. 1(A)–1(B) are a plan view and elevational section (along the line AA'), respectively, of an electron-beam microlithography apparatus according to a representative embodiment of the invention.

FIG. 1(C) shows additional detail of the indicated region in FIG. 1(B).

FIG. 3(B) depicts an exemplary circuit diagram.

DETAILED DESCRIPTION

Figure 2:
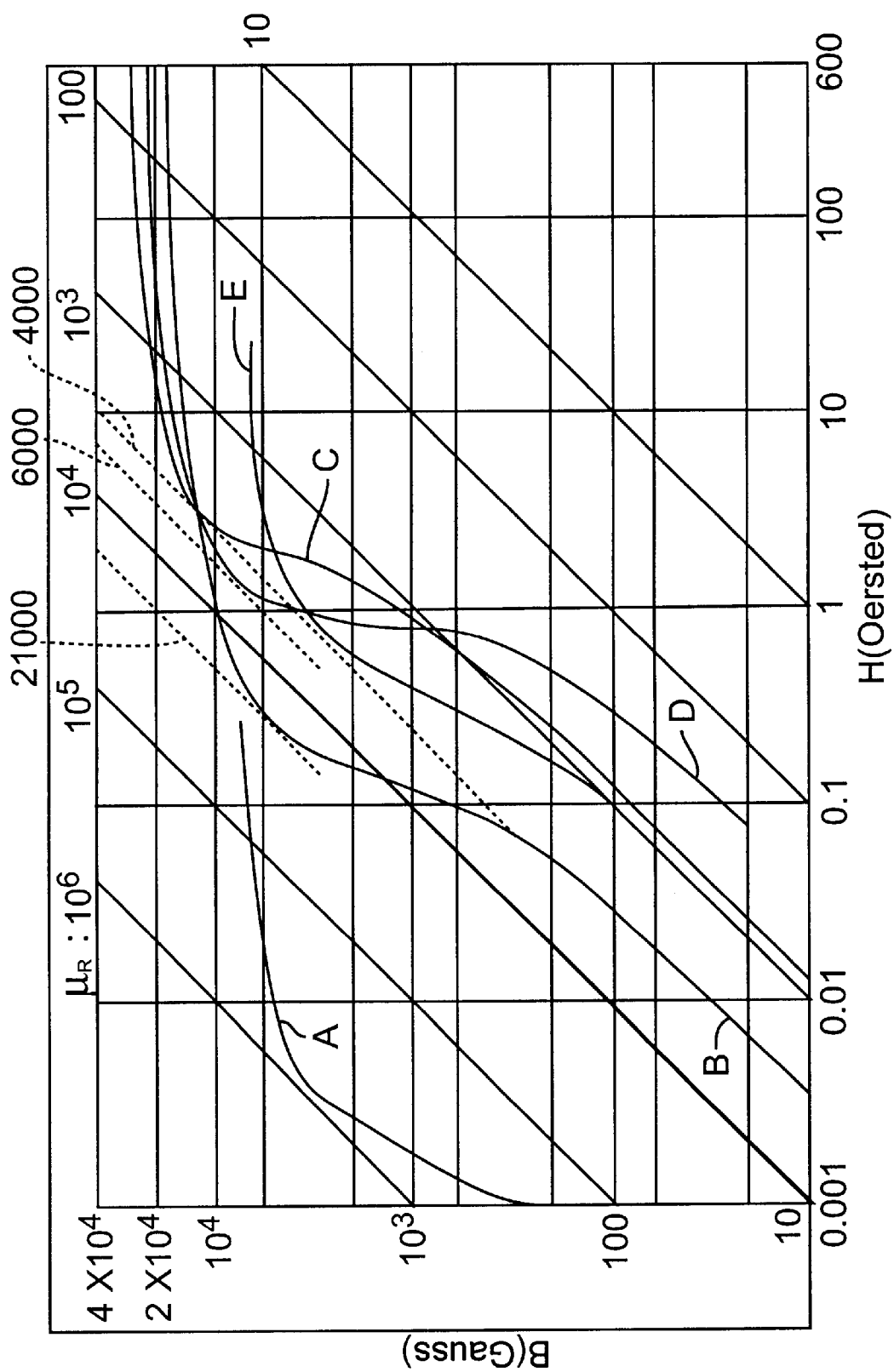
FIG. 2 is a plot of exemplary B–H curves (initial hysteresis curves) for various candidate materials useful for making shields according to the invention.

The invention is described below in the context of a representative embodiment, which is not intended to be limiting in any way.

General Considerations

Herein, a "reticle" is the master plate on which the pattern to be transferred is defined. In the art, "reticle" often is synonymous with "mask." A "substrate" is the plate onto which the reticle pattern is to be transferred. So as to be imprinted with the reticle pattern at time of exposure, the upstream-facing surface of the substrate is coated with a material, usually termed a "resist," that is sensitive to exposure by the charged particle beam. A substrate including a layer of unexposed resist is termed a "sensitive" substrate.

A "charged particle beam" as used herein can be an electron beam, ion beam, or the like. The representative embodiment described below is in the context of using an electron beam. However, the principles of this embodiment can be applied with equal facility to use of an alternative charged particle beam, such as an ion beam.

In general, a charged-particle-beam (CPB) microlithography apparatus according to the invention comprises a reticle stage and a substrate stage, each actuated by respective linear motors for movement in their respective X-Y planes. The reticle stage is housed in a reticle chamber and the substrate stage is housed in a substrate chamber. The apparatus also comprises an illumination-optical system and a projection-optical system that are contained in respective portions of a CPB-column that extends in the beam-propagation direction (usually regarded as the Z-axis direction). The reticle and substrate chambers are contiguous with the CPB-column. In each of the reticle chamber and substrate chamber, ferromagnetic "partition shields" are provided that are configured to shield the beam from effects of magnetic fields generated by the respective linear motors, as discussed further below.

The reticle and substrate chambers are made of a ferromagnetic material, which reduces the incursion of external magnetic fields into these chambers. Making these chambers of a ferromagnetic material also reduces the effects, of magnetic fields produced by the respective linear motors in these chambers, on respective portions of the CPB column extending from these chambers. The partition shields within these chambers also comprise a ferromagnetic material (construction details are provided later below). Each partition shield is configured with a respective gap so that the respective stage can be operated, in its respective chamber and into the CPB-column, without hindrance by the partition shields. Each partition shield extends so as to be situated as much as practicable between the respective linear motor and the CPB-column, and to reduce the effects of magnetic fields, generated by the respective linear motor, on the beam propagating through the CPB-column. As a result, the trajectory of the beam in the CPB-column is less susceptible to external magnetic fields or to magnetic fields generated by the linear motors, which increases the accuracy and precision of pattern transfer.

Desirably, the CPB-column also is magnetically shielded by being covered with a ferromagnetic material. The ferromagnetic material on the CPB-column can be thinner than the ferromagnetic material used to make portions of the respective shields in the reticle chamber and substrate chamber.

In the case of a cylindrical magnetic shield, the shielding factor Si at the i-th layer is expressed as follows:

$$S_i = \mu_i t_i / R_i \quad (1)$$

wherein $\mu_i$ is the relative permeability of the material of the i-th layer, $t_i$ is the thickness of the material of the i-th layer, and $R_i$ is the radius of the i-th layer.

Consider a shield having a relatively small-radius "tubular" portion connected to a coaxial disk portion extending radially from an end of the tubular portion. According to Equation (1), the tubular portion having a small radius will provide a large shielding factor even if $\mu_i t_i$ is small. Consequently, in this instance, a shielding material having a low relative permeability or that is relatively thin can be used. In contrast, to provide the disk portion with a similar large shielding factor, a material having a high relative permeability or that is relatively thick (compared to the material in the tubular portion) must be used.

Equation (1) also indicates that, because the radius of a magnetically shielded room is very large, a very thick shielding material must be used to achieve adequate magnetic shielding. Alternatively, and in contrast, shields incorporated into the reticle chamber and substrate chamber can be relatively thin.

Representative Embodiment

Reference is made to FIGS. 1(A)–1(C), depicting the basic structure of an electron-beam microlithography apparatus. FIG. 1(A) is a plan view and FIG. 1(B) is an elevational section along the line A–A'. FIG. 1(C) provides detail of the indicated region in FIG. 1(B). The apparatus comprises an illumination-optical system 1 (encased in a respective portion of the CPB column) and a projection-optical system 2 (encased in a respective portion of the CPB-column). A reticle chamber 3 is situated between the illumination-optical system 1 and the projection-optical system 2, and a substrate chamber 4 is situated downstream of the projection-optical system 2. Within the reticle chamber 3 is a reticle stage 5 driven by an X-direction linear motor 7 and a Y-direction linear motor 9. Within the substrate chamber 4 is a substrate stage 6 driven by an X-direction linear motor 8 and a Y-direction linear motor 10.

In this embodiment as depicted in FIGS. 1(A)–1(C), the optical axis of the illumination-optical system 1 and projection-optical system 2 extends in the Z-axis direction. Hence, the reticle stage 5 is driven in the X-axis direction and the Y-axis direction by the X-direction linear motor 7 and the Y-direction linear motor 9, respectively. Similarly, the substrate stage 6 is driven in the X-axis direction and Y-axis direction by the X-direction linear motor 8 and the Y-direction linear motor 10, respectively.

The respective portions of the CPB-column enclosing the illumination-optical system 1 and the projection-lens system 2 have walls made from a relatively thick ferromagnetic material (desirably iron or Invar). For example, the thickness is 0.1 mm, which provides an enhanced magnetic-shielding effect. The walls of the reticle chamber 3 and substrate chamber 4 also are thick (e.g., 0.1 mm) and desirably are made of the same material as the walls of the CPB-column portions. With such construction, there is very little incursion of external magnetic fields into these chambers or into the CPB-column.

Each of the linear motors 7, 8, 9, 10 generates a powerful magnetic field, as mentioned above. In order to contain these magnetic fields within the respective linear motor, each of the linear motors 7–10 is encased in an individual magnetic shield. However, this casement shielding alone is insufficient to achieve adequate isolation of the charged particle beam from the magnetic fields produced by the linear motors. Hence, this embodiment comprises partition shields 11, 12, 13, 14. The partition shields 11, 12 are situated in the reticle chamber 3, such that the X-direction linear motor 7 is sandwiched between "upper" and "lower" members of the partition shield 12, and the Y-direction linear motor 9 is sandwiched between the "upper" and "lower" members of the partition shield 11. The partition shields 11, 12 collectively form a "gap" 15 that separates the upper and lower members of these shields. The gap 15 actually is defined between the edges of opposing lip portions 12a, 12b and 11a, 11b of the partition shields 12, 11, respectively. The gap 15 is dimensioned (in the Z-direction) sufficiently wide for the reticle stage 5 to move in the X- and Y-directions through the gap 15 without obstruction. Similarly, the partition shields 13, 14 are situated in the substrate chamber 4, such that the X-direction linear motor 8 is sandwiched between "upper" and "lower" members of the partition shield 13, and the Y-direction linear motor 10 is sandwiched between the "upper" and "lower" members of the partition shield 14. The partition shields 13, 14 collectively form a "gap" 16 that separates the upper and lower members of these shields. The gap 16 actually is defined between the edges of opposing lip portions 13a, 13b and 14a, 14b of the partition shields 13, 14, respectively. The gap 16 is dimensioned (in the Z-direction) sufficiently wide for the substrate stage 6 to move in the X- and Y-directions through the gap 16 without obstruction. The partition shields 12 and 11 prevent incursion of magnetic fields from the linear motors 7, 9, respectively, to the interior of the CPB column 1, 2, and the partition shields 13 and 14 prevent incursion of magnetic fields from the linear motors 8, 10, respectively, to the interior of the CPB column 2. Desirably, the shields extend as much as practicable between the respective motors and respective column.

Each of the partition shields 11, 12, 13, 14 has a laminar ("cladded") construction comprising, for example, three layers of ferromagnetic material 17 sandwiching interposed layers 18 of non-magnetic material (FIG. 1(C)). An exemplary ferromagnetic material is Permalloy and an exemplary non-magnetic material is copper. Each layer 17, 18 has a thickness of, e.g., 0.5 $\mu$m. The partition shields 11, 12 are mounted to the interior surfaces of the "upper" and "lower" walls of the reticle chamber 3 by non-magnetic material 19. Similarly, the partition shields 13, 14 are mounted to the interior surfaces of the "upper" and "lower" walls of the substrate chamber 4 by non-magnetic material 19. Thus, as shown in FIGS. 1(A)–1(C), respective partition shields are situated between the CPB column portions 1, 2 and the reticle chamber 3 and between the CPB column portion 2 and the substrate chamber 4.

In each partition shield 11–14, of the three layers 17 of ferromagnetic material, the two layers 20 closest to the CPB-column (FIG. 1(C)) desirably are made of Supermalloy with a high relative permeability. The layer 21 closest to the respective linear motor desirably is made of Permalloy 45 or pure iron with a high saturation magnetic flux density.

Thus, in this embodiment, external magnetic fields and magnetic fields generated by the linear motors are sufficiently well blocked from reaching the CPB-column so as not to impart any significant disturbance of the trajectory of the electron beam in the CPB-column.

After the respective materials and thicknesses of the layers of the partition shields 11–14 have been determined, and after they have been configured for use, Equation (1) indicates the desirability of using a ferromagnetic material having the highest relative permeability to achieve the best shielding effect. In this regard, FIG. 2 shows representative B–H curves (initial hysteresis curves) for various candidate materials. "A" denotes Supermalloy, "B" denotes Permalloy 45, "C" denotes Permendure, "D" denotes electromagnetic soft iron, and "E" denotes Invar. In the plot, the lines angled at 45° facilitate the determination of relative permeabilities ($\mu_R$).

As evident from FIG. 2, the relative permeability of a material increases with extent of magnetization of the material. For each material, with increasing magnetization, the respective relative permeability reaches a maximum and then decreases as the material is magnetized further. To find a numerical value of the maximum relative permeability of a material, a 45° line is extended from the point on a B–H curve for the material at which the relative permeability is highest. This numerical value corresponds to the maximum permeability for the material. For example, note that Permalloy 45 has a maximum permeability of 21000, soft iron has a maximum permeability of 6000, and Permendure has a maximum permeability of 4000 (dotted lines).

Figure 3A:
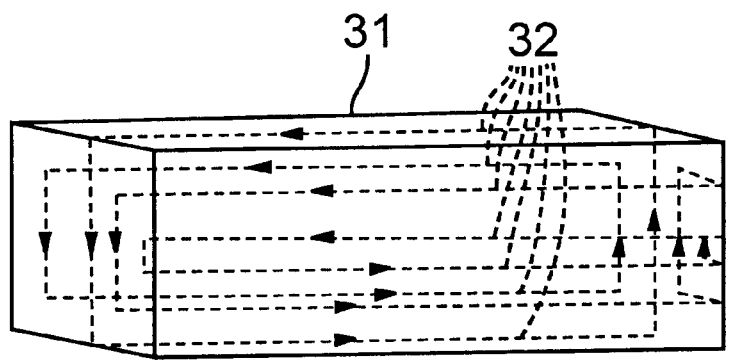
FIGS. 3(A)–3(B) depict a method, according to a representative embodiment for controlling and adjusting the relative permeability of the shielding material, wherein FIG. 3(A) depict magnetic field lines
Figure 3B:
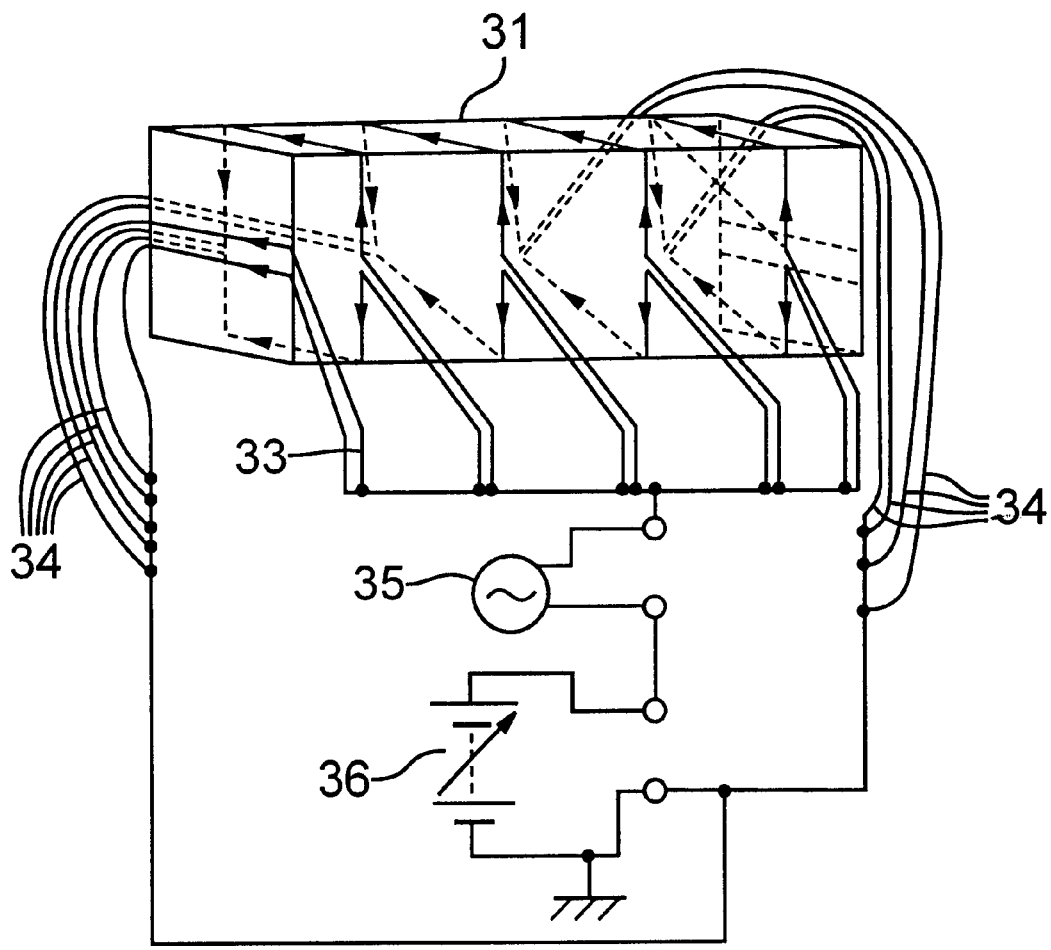

Thus, to obtain the greatest shielding effect after the shield material and other variables (see above) have been determined, the extent of magnetization of the shielding material is varied until the maximum permeability is achieved. This method is illustrated in FIGS. 3(A)–3(B). In these figures, item 31 is a reticle chamber or substrate chamber, and items 32 (indicated by broken lines) denote lines of magnetic flux. Items 33 and 34 are wires that form a coil, item 35 is an AC power supply, and item 36 is a DC power supply.

As shown in FIG. 3(B), the wires 33, 34 form coils wound around the chamber 31. AC power (from the AC power supply 35) and biased by DC power from the DC power supply 36) is applied to the coils, which generates a magnetic field 32 having an orientation as shown in FIG. 3(A). The magnetic flux produced by this magnetic field 32 circulates within the ferromagnetic material of which the chamber 31 is made, and hence does not leak outside the chamber. In this state, the amplitude of the AC voltage is lowered gradually so as to reduce the respective hysteresis successively. Finally, the ferromagnetic material of the chamber 31 is magnetized to a degree determined by the output of the DC power supply 36.

With this method, the magnetization state of the ferromagnetic material of which the chamber 31 is made is varied as required to obtain maximal permeability. Repeating this operation periodically allows the magnetic shielding in the chamber to be optimized at all times.

Figure 4:
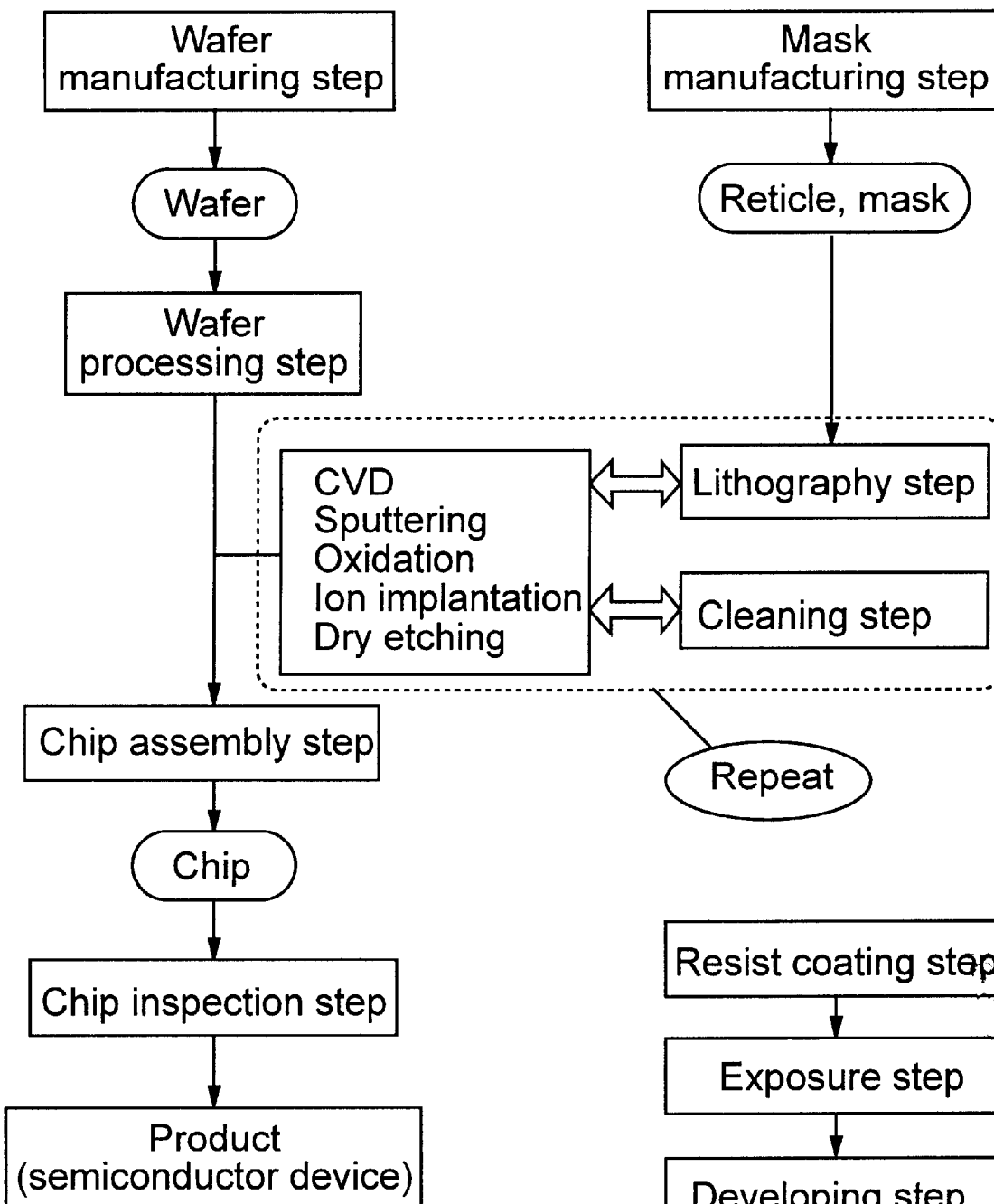
FIG. 4 is a process flowchart for manufacturing a microelectronic device, wherein the process includes a microlithography method according to the invention.

FIG. 4 is a flowchart of an exemplary microelectronic-fabrication method in which apparatus and methods according to the invention can be applied readily. The fabrication method generally comprises the main steps of wafer production (wafer manufacturing or preparation), reticle (mask) production or preparation; wafer processing, device (chip) assembly (including dicing of chips and rendering the chips operational), and device (chip) inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry-etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

Figure 5:
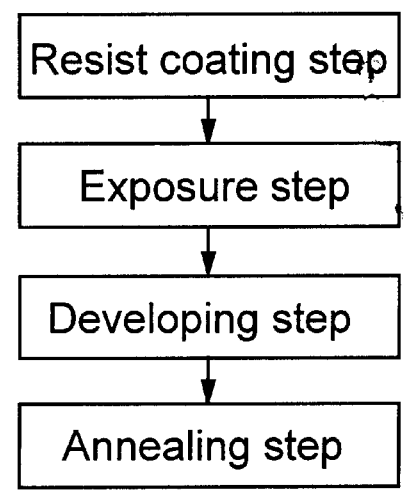
FIG. 5 is a process flowchart for performing a microlithography method that includes use of a microlithography apparatus according to the invention.

FIG. 5 provides a flowchart of typical steps performed in microlithography, which is a principal step in the wafer processing step shown in FIG. 4. The microlithography step typically includes: (1) resist-application step, wherein a suitable resist is coated on the wafer substrate (which an include a circuit element formed in a previous wafer-processing step); (2) exposure step, to expose the resist with the desired pattern by microlithography; (3) development step, to develop the exposed resist to produce the imprinted image; and (4) optional resist-annealing step, to enhance the durability of and stabilize the resist pattern.

The process steps summarized above are all well known and are not described further herein.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. A charged-particle-beam (CPB) microlithography apparatus, comprising:
    an illumination-optical system and projection-optical system contained within a CPB-column;
    a reticle stage configured to hold a reticle during microlithographic exposure, the reticle stage being actuated by a respective linear motor;
    a substrate stage configured to hold a substrate during microlithographic exposure, the substrate stage being actuated by a respective linear motor;
    a reticle chamber containing the reticle stage and its respective linear motor, the reticle chamber being situated between the illumination-optical system and the projection-optical system and being made of a ferromagnetic material;
    a substrate chamber containing the substrate stage and its respective linear motor, the substrate chamber being situated downstream of the projection-optical system and being made of a ferromagnetic material;
    a first partition shield, made of a ferromagnetic material, situated in the reticle chamber between the respective linear motor and the CPB-column, the first partition shield defining a gap allowing unobstructed movement of the reticle stage through the gap; and
    a second partition shield, made of a ferromagnetic material, situated in the substrate chamber between the respective linear motor and the CPB column, the second partition shield defining a gap allowing unobstructed movement of the substrate stage through the gap.

2. The apparatus of claim 1, wherein each of the first and second partition shields comprises opposing lip portions having respective edges between which the respective gap is defined.

3. The apparatus of claim 1, wherein each partition shield is attached to an inside wall of the respective chamber by a non-magnetic fastener.

4. The apparatus of claim 1, wherein:
    each of the reticle and substrate stages extends in a respective X–Y plane that is perpendicular to a Z-axis; and
    each partition shield comprises a first portion extending in a respective X–Y plane on one side of the respective linear motor, and a second portion extending in a respective X–Y plane on an opposing side of the respective linear motor.

5. The apparatus of claim 4, wherein, with respect to each of the partition shields, the first and second portions are separately attached to respective inside walls of the respective chamber by a non-magnetic fastener.

6. The apparatus of claim 4, wherein, with respect to each of the partition shields:
    each of the first and second portions defines a respective lip portion;
    the lip portions are situated opposite each other in the X-direction; and
    the lip portions have respective edges between which the respective gap is defined.

7. The apparatus of claim 1, wherein:
    each of the partition shields comprises multiple sheet layers of ferromagnetic material; and
    between each pair of sheet layers of ferromagnetic material is a respective sheet layer of non-magnetic material.

8. The apparatus of claim 7, wherein, with respect to each of the partition shields:
    the sheet layer of ferromagnetic material situated closest to the CPB-column has a high relative permeability; and
    the sheet layer of ferromagnetic material situated closest to the respective linear motor has a relatively high saturation magnetic flux density.

9. A charged-particle-beam (CPB) microlithography apparatus, comprising:
    an illumination-optical system and projection-optical system contained within a CPB-column;
    a reticle stage configured to hold a reticle during microlithographic exposure, the reticle stage being actuated by a respective linear motor;
    a substrate stage configured to hold a substrate during microlithographic exposure, the substrate stage being actuated by a respective linear motor;
    a reticle chamber containing the reticle stage and its respective linear motor, the reticle chamber being situated between the illumination-optical system and the projection-optical system and being made of a ferromagnetic material;
    a substrate chamber containing the substrate stage and its respective linear motor, the substrate chamber being situated downstream of the projection-optical system and being made of a ferromagnetic material; and
    a coil individually situated relative to at least one of the reticle chamber and substrate chamber, the coil being configure to circulate a magnetic flux through the ferromagnetic material of the respective chamber.

10. The apparatus of claim 9, wherein each of the reticle chamber and substrate chamber includes a respective coil.

11. The apparatus of claim 9, wherein the coil is situated externally to the respective chamber.

12. The apparatus of claim 9, wherein the coil is configured to be energized by AC power biased by DC power.

13. The apparatus of claim 12, wherein the coil is energized to be magnetized as required to achieve a maximal permeability of the ferromagnetic material of the respective chamber.

14. The apparatus of claim 9, wherein at least one of the reticle chamber and substrate chamber further comprises a partition shield, made of a ferromagnetic material, situated in the respective chamber between the respective linear motor and the CPB-column, the partition shield defining a gap allowing unobstructed movement of the respective stage through the gap.

15. The apparatus of claim 9, further comprising:
   a first partition shield, made of a ferromagnetic material, situated in the reticle chamber between the respective linear motor and the CPB-column, the first partition shield defining a gap allowing unobstructed movement of the reticle stage through the gap; and
   a second partition shield, made of a ferromagnetic material, situated in the substrate chamber between the respective linear motor and the CPB column, the second partition shield defining a gap allowing unobstructed movement of the substrate stage through the gap.

16. In a method for performing microlithography of a pattern, defined by a reticle, onto a substrate using a charged particle beam that is passed through an illumination-optical system and projection-optical system contained in a CPB-column, wherein the reticle is held on a reticle stage contained in a reticle chamber and the substrate is held on a substrate stage contained in a substrate chamber, and at least one of the stages is driven by a respective linear motor in the respective chamber, a method for reducing incursion of a magnetic field from the linear motor to the charged particle beam in the CPB-column, the method comprising:
   (a) providing at least one partition shield made of a ferromagnetic material;
   (b) placing a respective partition shield in each of the reticle chamber and substrate chamber that also contains a respective linear motor; the respective partition shield being situated between the respective linear motor and the CPB-column, the respective partition shield defining a gap allowing unobstructed movement of the respective stage through the gap.

17. The method of claim 16, wherein:
   the respective stage extends in a respective X–Y plane that is perpendicular to a Z-axis,;
   step (a) further comprises providing the partition shield with a first portion and a second portion; and
   step (b) further comprises situating the first portion so as to extend in a respective X–Y plane on one side of the respective linear motor, and situating the second portion so as to extend in a respective X–Y plane on an opposing side of the respective linear motor.

18. The method of claim 17, wherein step (b) further comprises attaching the first and second portions to respective inside walls of the respective chamber using a non-magnetic fastener.

19. The method of claim 16, wherein step (b) further comprises:
   providing each partition shield with multiple sheet layers of ferromagnetic material; and
   interposing a separate sheet layer of non-magnetic material between each pair of sheet layers of ferromagnetic material.

20. The method of claim 19, wherein:
   in step (a), at least one sheet layer of ferromagnetic material has a high relative permeability, and at least one other sheet layer of ferromagnetic material has a relatively high saturation magnetic flux density; and
   step (b) further comprises situating the sheet layer having high relative permeability closest to the CPB-column, and situating the sheet layer having the relatively high saturation magnetic flux density closest to the respective linear motor.

21. The method of claim 16, further comprising the steps of:
   situating a coil relative to the respective chamber containing the linear motor; and
   configuring the coil to circulate, whenever the coil is electrically energized, a magnetic flux through the ferromagnetic material of the respective chamber.

22. The method of claim 21, further comprising the step of energizing the coil by AC power biased by DC power.

* * * * *

UNITED STATES PATENT AND TRADEMARK OFFICE
CERTIFICATE OF CORRECTION

PATENT NO. : 6,614,034 B2
DATED : September 2, 2003
INVENTOR(S) : Nakasuji

It is certified that error appears in the above-identified patent and that said Letters Patent is hereby corrected as shown below:

<u>Column 9,</u>
Line 24, "which an" should read -- which can --

<u>Column 12,</u>
Line 7, "Z-axis,;" should read -- Z-axis; --

Signed and Sealed this

Ninth Day of November, 2004

JON W. DUDAS
*Director of the United States Patent and Trademark Office*